(12) United States Patent
Sekine et al.

(10) Patent No.: US 7,427,518 B2
(45) Date of Patent: Sep. 23, 2008

(54) SEMICONDUCTOR DEVICE FABRICATION METHOD AND FABRICATION APPARATUS

(75) Inventors: Katsuyuki Sekine, Yokohama (JP); Seiji Inumiya, Tsukuba (JP); Motoyuki Sato, Yokohama (JP); Akio Kaneko, Kawasaki (JP); Kazuhiro Eguchi, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/260,253

(22) Filed: Oct. 28, 2005

(65) Prior Publication Data

US 2006/0093731 A1    May 4, 2006

(30) Foreign Application Priority Data

Oct. 28, 2004    (JP) .............................. 2004-314154

(51) Int. Cl.
*H01L 21/00* (2006.01)
(52) U.S. Cl. .............................. 438/7; 438/16; 438/513; 438/514; 438/788; 438/792; 257/E21.53
(58) Field of Classification Search ................ 438/400, 438/7, 16, 513, 514, 788, 792; 257/E21.53
See application file for complete search history.

(56) References Cited

U.S. PATENT DOCUMENTS

| | | | | | |
|---|---|---|---|---|---|
| 5,264,328 | A | * | 11/1993 | DellaGuardia et al. | ....... 430/322 |
| 5,362,356 | A | * | 11/1994 | Schoenborn | ................. 216/60 |
| 5,612,014 | A | * | 3/1997 | Inoue et al. | ................. 423/417 |
| 5,728,212 | A | * | 3/1998 | Inoue et al. | ................... 117/19 |
| 5,877,032 | A | * | 3/1999 | Guinn et al. | ................... 438/9 |
| 6,081,334 | A | * | 6/2000 | Grimbergen et al. | ........ 356/499 |
| 6,340,603 | B1 | * | 1/2002 | Bell | ............................. 438/9 |
| 6,381,008 | B1 | * | 4/2002 | Branagh et al. | ............... 356/72 |
| 6,492,186 | B1 | * | 12/2002 | Han et al. | ...................... 438/8 |
| 2002/0183977 | A1 | * | 12/2002 | Sui et al. | ..................... 702/188 |
| 2003/0153101 | A1 | * | 8/2003 | Takase et al. | .................. 438/7 |
| 2003/0222287 | A1 | * | 12/2003 | Tamura | ...................... 257/213 |

FOREIGN PATENT DOCUMENTS

| | | |
|---|---|---|
| JP | 9-205076 | 8/1997 |
| JP | 2002-093781 | 3/2002 |
| JP | 2002-231695 | 8/2002 |
| JP | 2002-299322 | 10/2002 |

* cited by examiner

*Primary Examiner*—Matthew S. Smith
*Assistant Examiner*—Jarrett J Stark
(74) *Attorney, Agent, or Firm*—Finnegan, Henderson, Farabow, Garrett & Dunner, L.L.P.

(57) ABSTRACT

According to the present invention, there is provided a semiconductor device fabrication method comprising:
measuring light emission intensity of at least one type of wavelength contained in light emitted from a plasma, when one of nitriding, oxidation, and impurity doping is to be performed on a surface of a semiconductor substrate in a processing vessel by using the plasma;
calculating, for each semiconductor substrate, an exposure time during which the semiconductor substrate is exposed to the plasma, on the basis of the measured light emission intensity; and
exposing each semiconductor substrate to the plasma on the basis of the calculated exposure time, thereby performing one of the nitriding, oxidation, and impurity doping.

17 Claims, 6 Drawing Sheets

SEMICONDUCTOR DEVICE FABRICATION METHOD AND FABRICATION APPARATUS

CROSS REFERENCE TO RELATED APPLICATION

This application is based upon and claims benefit of priority under 35 USC §119 from the Japanese Patent Application No. 2004-314154, filed on Oct. 28, 2004, the entire contents of which are incorporated herein by reference.

BACKGROUND OF THE INVENTION

The present invention relates to a semiconductor device fabrication method and fabrication apparatus and, more particularly, to a method and apparatus suitable for nitriding, oxidation, or impurity doping using a plasma.

In a nitriding or oxidation step for surface modification using a plasma or in an impurity doping step using a plasma, the film thickness of a thin film formed on the surface or the impurity amount to be doped is controlled by maintaining the time during which a semiconductor substrate is exposed to the plasma constant.

If, however, the plasma state varies even slightly owing to causes like disturbances, e.g., changes in temperature of a chamber or high-frequency application circuit, changes in flow rate of a gas flow rate controller, or changes in pressure of a pressure controller, the density of a main active species which contributes to a reaction in the plasma changes.

Even in this case, the processing is conventionally performed for a predetermined time. Consequently, the film thickness of a thin film formed on the surface or the impurity amount fluctuates between wafers or lots, and the characteristics of finally formed transistors vary.

The references disclosing techniques concerning the conventional surface modification processes and impurity doping are as follows.

Reference 1: Japanese Patent Laid-Open No. 2002-93781
Reference 2: Japanese Patent Laid-Open No. 2002-231695
Reference 3: Japanese Patent Laid-Open No. 9-205076
Reference 4: Japanese Patent Laid-Open No. 2002-299322

SUMMARY OF THE INVENTION

According to one aspect of the invention, there is provided a semiconductor device fabrication method comprising:

measuring light emission intensity of at least one type of wavelength contained in light emitted from a plasma, when one of nitriding, oxidation, and impurity doping is to be performed on a surface of a semiconductor substrate in a processing vessel by using the plasma;

calculating, for each semiconductor substrate, an exposure time during which the semiconductor substrate is exposed to the plasma, on the basis of the measured light emission intensity; and exposing each semiconductor substrate to the plasma on the basis of the calculated exposure time, thereby performing one of the nitriding, oxidation, and impurity doping.

According to one aspect of the invention, there is provided a semiconductor device fabrication apparatus comprising:

a processing vessel which accommodates a semiconductor substrate;

a plasma generator which generates a plasma in said processing vessel;

a light emission intensity sensor which measures light emission intensity of at least one type of wavelength contained in light emitted from the plasma generated in said processing vessel;

a calculator which, when each semiconductor substrate is to be processed, calculates an exposure time during which the semiconductor substrate is exposed to the plasma, on the basis of the measured light emission intensity; and a gas supply unit which supplies, into said processing vessel, a gas for performing one of nitriding, oxidation, and impurity doping by exposing each semiconductor substrate to the plasma, on the basis of the calculated exposure time.

According to one aspect of the invention, there is provided a semiconductor device fabrication apparatus comprising:

a processing vessel which accommodates a semiconductor substrate;

a plasma generator which generates a plasma in said processing vessel;

a light emission intensity sensor which measures light emission intensity of at least one type of wavelength contained in light emitted from the plasma generated in said processing vessel;

a tuner having a tuner position which reflects a state of the plasma generated by said plasma generator;

a calculator which, when each semiconductor substrate is to be processed, calculates an exposure time during which the semiconductor substrate is exposed to the plasma, on the basis of the measured light emission intensity, and adjusts the exposure time on the basis of the tuner position; and a gas supply unit which supplies, into said processing vessel, a gas for performing one of nitriding, oxidation, and impurity doping by exposing each semiconductor substrate to the plasma, on the basis of the calculated exposure time.

DETAILED DESCRIPTION OF THE INVENTION

Embodiments of the present invention will be described below with reference to the accompanying drawings.

(1) First Embodiment

Figure 1:
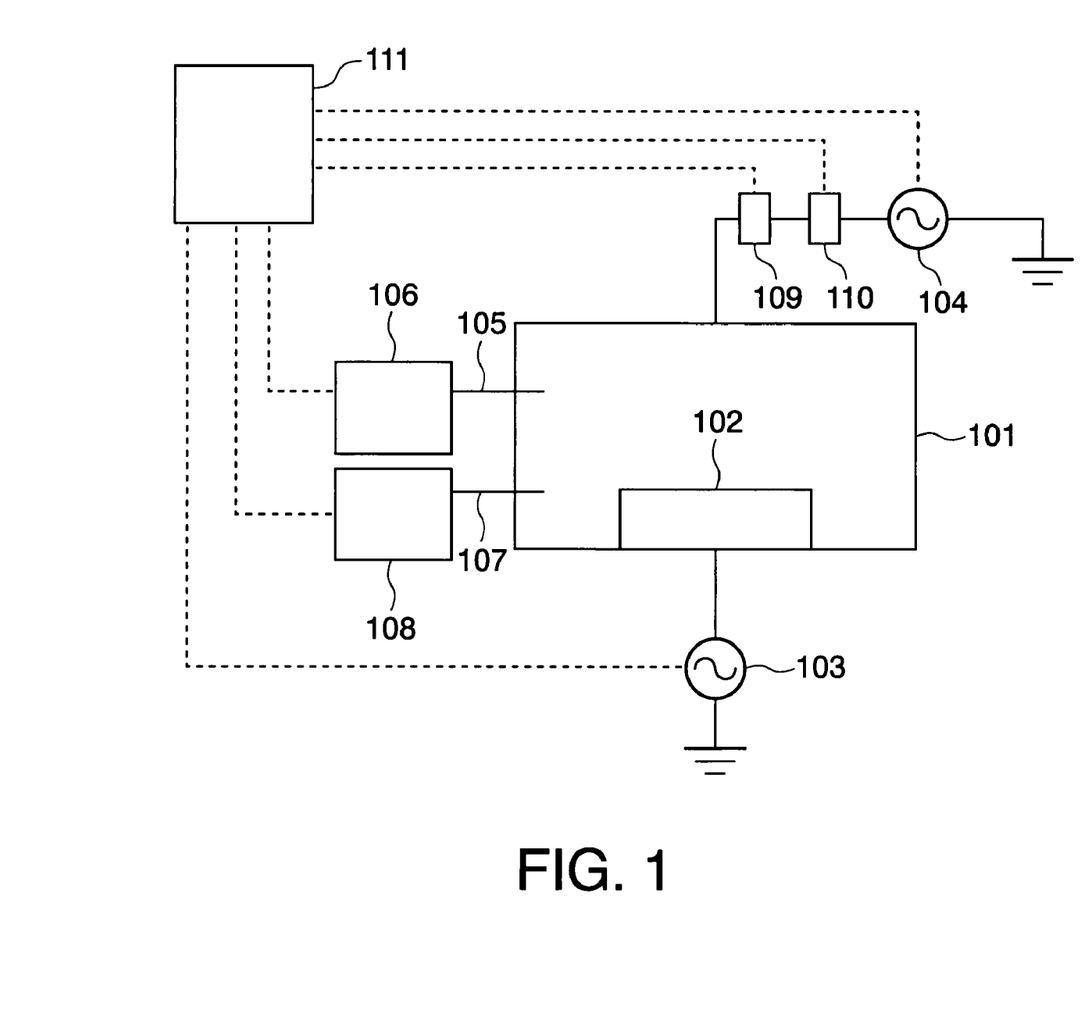
FIG. 1 is a block diagram showing the arrangement of a semiconductor device fabrication apparatus for use in the first to third embodiments of the present invention.

FIG. 1 shows the arrangement of a semiconductor device fabrication apparatus for use in each of semiconductor device fabrication methods according to the first to third embodiments of the present invention.

A wafer support electrode 102 is formed on the inner bottom surface of a vacuum vessel 101 as an example of a processing vessel for performing plasma processing. A gas supply port 105 and light emission intensity analyzing sensor 107 are formed on the side surface of the vacuum vessel 101.

The wafer support electrode 102 is connected to a high-frequency bias power supply 103 and supplied with a bias voltage.

Nitriding and oxidation require no such bias voltage, and impurity doping requires a bias voltage to increase the acceleration voltage during ion implantation.

A gas supply system 106 is connected to the gas supply port 105, and supplies a gas necessary for nitriding, oxidation, or impurity doping.

An emission spectrometer 108 is connected to the light emission intensity analyzing sensor 107, and measures the light emission intensity of a reaction species (active species) which has a predetermined wavelength and contributes to a reaction in a plasma in the vacuum vessel 101.

A tuner 109 for adjusting the plasma density is attached to the vacuum vessel 101. The tuner 109 is connected to an incident wave/reflected wave monitor 110 as a unit for measuring the incident power and reflected power. The tuner 109 is also connected to a high-frequency power supply 104 which supplies a high-frequency voltage necessary to generate a plasma in the vacuum vessel 101.

Assume that a power of A (W) is supplied as an incident wave from the high-frequency power supply 104 to the vacuum vessel 101, a plasma generated as a conductor on the inner upper surface of the vacuum vessel 101 reflects this incident wave, and a power of B (W) is reflected as a reflected wave to the high-frequency power supply 104. In this case, the electric power which contributes to the plasma generation is A−B (W).

The incident wave/reflected wave monitor 110 measures and monitors the incident power of the incident wave and the reflected power of the reflected wave as described above.

To suppress the generation of the reflected wave, the tuner 109 adjusts the impedance of a power path from the high-frequency power supply 104 to the plasma generation portion in the vacuum vessel 101. A tuner position indicating the value of this impedance reflects the plasma state in the vacuum vessel 101, e.g., the plasma density, so the tuner position remains unchanged for the same plasma state. When a plurality of semiconductor substrates are to be processed, therefore, the same processing time can be used if the tuner position remains the same, but the processing time must be controlled in accordance with the plasma state if the tuner position changes from one substrate to another.

The high-frequency bias power supply 103, high-frequency power supply 104, tuner 109, incident wave/reflected wave monitor 110, gas supply system 106, and emission spectrometer 108 are connected to a CPU 111 and operated under the control of the CPU 111.

A semiconductor wafer (not shown) is placed on the wafer support electrode 102 in the vacuum vessel 101. In an impurity doping step, a high-frequency bias voltage is applied from the high-frequency bias power supply 103 via the wafer support electrode 102.

A gas is supplied into the vacuum vessel 101 from the gas supply system 106 via the gas supply port 105.

When nitriding is to be performed, a gas containing nitrogen, e.g., an $Ar/N_2$ gas mixture is supplied. It is also possible to use a gas containing hydrogen in addition to nitrogen, e.g., $NH_3$, as a nitrogen source.

When oxidation is to be performed, a gas containing oxygen, e.g., an $Ar/O_2$ gas mixture is supplied.

If boron, for example, is to be doped in the impurity doping step, an $Ar/B_2H_6$ gas mixture is used.

The internal pressure of the vacuum vessel 101 is measured by a pressure gauge (not shown), and set at 50 mTorr by an evacuator. In addition, plasma excitation is performed by supplying a high frequency of, e.g., 13.56 MHz from the high-frequency power supply 104 into the vacuum vessel 101.

The light emission intensity analyzing sensor 107 monitors the light emission intensity of a reaction species having a predetermined wavelength in the light emitted from the plasma.

In the nitriding process, for example, the light emission intensity of an $N_2^+$ ion having a predetermined wavelength near, e.g., 391 nm in the light emitted from the plasma is measured.

In the oxidation process, the light emission intensity of an oxygen radical having a wavelength near, e.g., 777 nm is monitored.

If boron, for example, is to be doped in the impurity doping step, the light emission intensity of boron having a wavelength near 550 nm is monitored.

In the first embodiment, the light emission intensity of a wavelength near 391 nm is measured by taking account of the deterioration of the detection level caused by light emission of a rare gas. However, it is possible to measure the light emission intensity of any wavelength as long as the light emission is caused by nitrogen.

When a gas containing hydrogen such as $NH_3$ is used as a nitrogen source, the light emission intensity caused by NH may also be measured.

In the first embodiment, the apparatus as described above is used to measure the light emission intensity of a reaction species which contributes to the reaction of nitriding by the light emission intensity analyzing sensor 107, and change the processing time in accordance with the obtained light emission intensity.

The formation of a silicon oxynitride film by the semiconductor device fabrication method according to the first embodiment and the formation of a silicon oxynitride film by Comparative Example 1 will be described below.

In the first embodiment, a 2.0-nm thick silicon oxide film was formed at 900° C. and $O_2$ 760 Torr by thermal oxidation on a semiconductor substrate cleaned with dilute hydrofluoric acid. After that, this semiconductor substrate was placed on the wafer support electrode 102 in the vacuum vessel 101 shown in FIG. 1, and a nitrogen-containing gas was supplied to form a silicon oxynitride film while the plasma processing time was changed from one substrate to another in accordance with the measurement result of the light emission intensity of the nitrogen ion.

In Comparative Example 1, silicon oxynitride films were formed on all substrates for a predetermined plasma processing time without measuring the light emission intensity.

The nitrogen concentration of each of the silicon oxynitride films formed in accordance with the first embodiment and Comparative Example 1 were measured to check the intra-lot stability. The nitrogen concentration of each silicon oxynitride film was measured by optoelectronic spectrophotometry.

In the method according to the first embodiment, the nitriding time of each semiconductor substrate was controlled such that (the light emission intensity of a nitrogen radical having a wavelength of 391 nm)×((processing time)$^{1/2}$) was constant.

Figure 2:
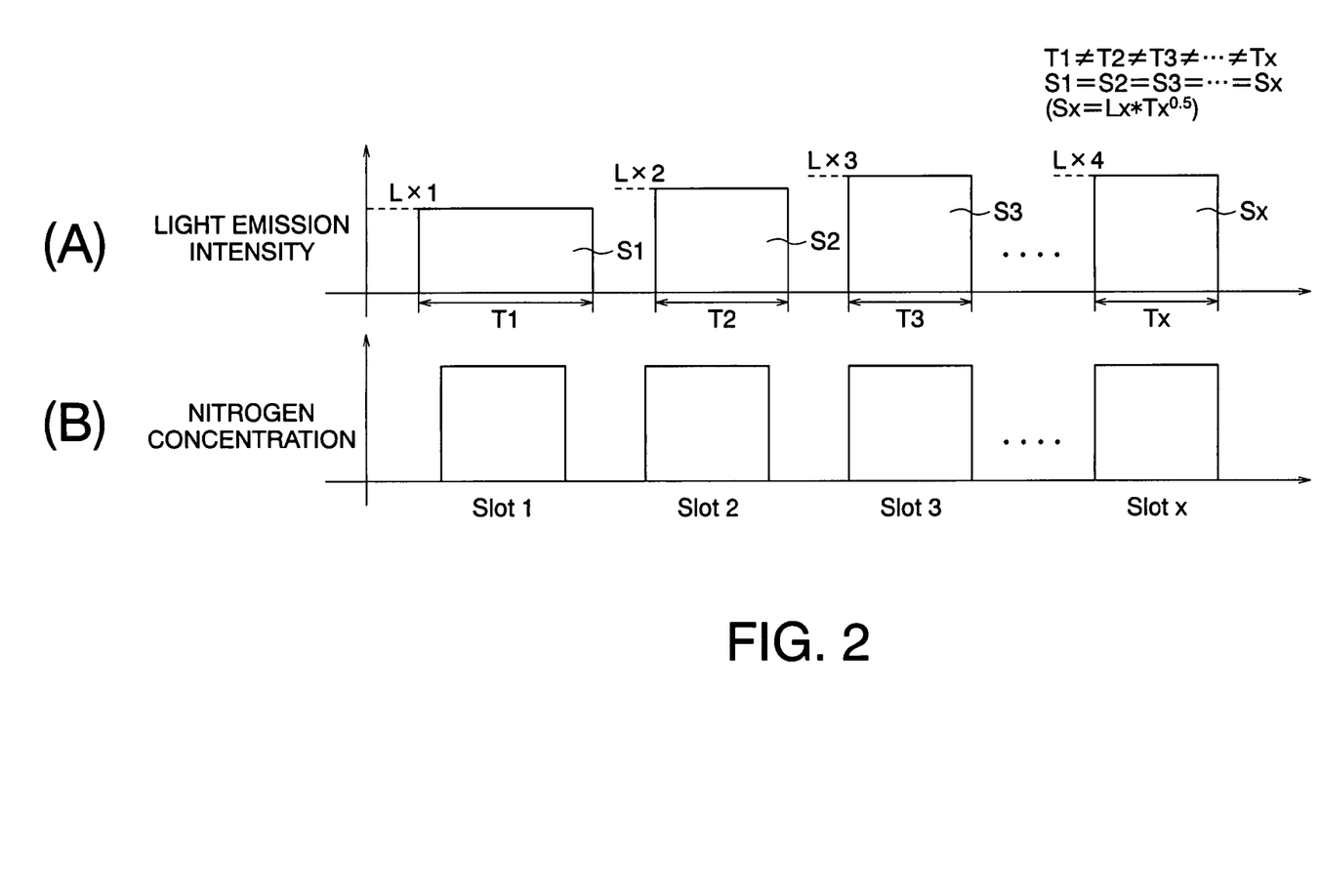
FIGS. 2A and 2B are graphs showing the results of measurements of the light emission intensity and nitrogen concentration, respectively, when nitriding was performed in accordance with the first embodiment.

FIG. 2A shows light emission intensities Lx1, Lx2, Lx3, . . . , Lxx measured for x (x is an integer of 2 or more) lots Slot1, Slot2, Slot3, . . . , Slotx, respectively. The light emission intensity changes from one lot to another, and the following relationship holds.

$$Lx1 \neq Lx2 \neq Lx3 \neq, \ldots, \neq Lxx \quad (1)$$

One possible reason why the light emission intensity changes from one lot to another is that the internal temperatures of the high-frequency bias power supply 103 and vacuum vessel 101 gradually increase from the initial lot.

That is, since the high-frequency bias power supply 103 and vacuum vessel 101 consume electric power in order to heat themselves to necessary temperatures, no sufficient power is supplied for plasma generation, and this presumably lowers the light emission intensity of the initial lot.

Then, different processing times T1, T2, T3, . . . , Tx are calculated for the individual lots so that the following relation holds.

$$S1 = S2 = S3 =, \ldots, = Sx \quad (2)$$

where $Sx = Lx * Tx^{0.5}$ (3)

Each of S1, S2, S3, . . . , Sx is equivalent to the physical quantity corresponding to the nitrogen radical amount supplied to the surface of a semiconductor substrate in each lot.

The processing time T is $T^{0.5}$ because the rate at which atoms of, e.g., nitrogen or oxygen diffuse in a film is proportional to the (½)th power of the time.

The concentrations of nitrogen in silicon oxynitride films processed for processing times T1, T2, T3, . . . , Tx calculated as above were measured in the individual lots. FIG. 2B shows the results of the measurements.

The nitrogen concentrations in lots Slot1, Slot2, Slot3, . . . , Slotx were substantially the same. This demonstrates that when silicon oxynitride films are formed by performing nitriding in accordance with the first embodiment, variations in nitrogen concentration between the lots can be suppressed.

On the other hand, in the method according to Comparative Example 1, the nitriding time of each semiconductor substrate was constant regardless of the light emission intensity of the nitrogen radical.

Figure 3:
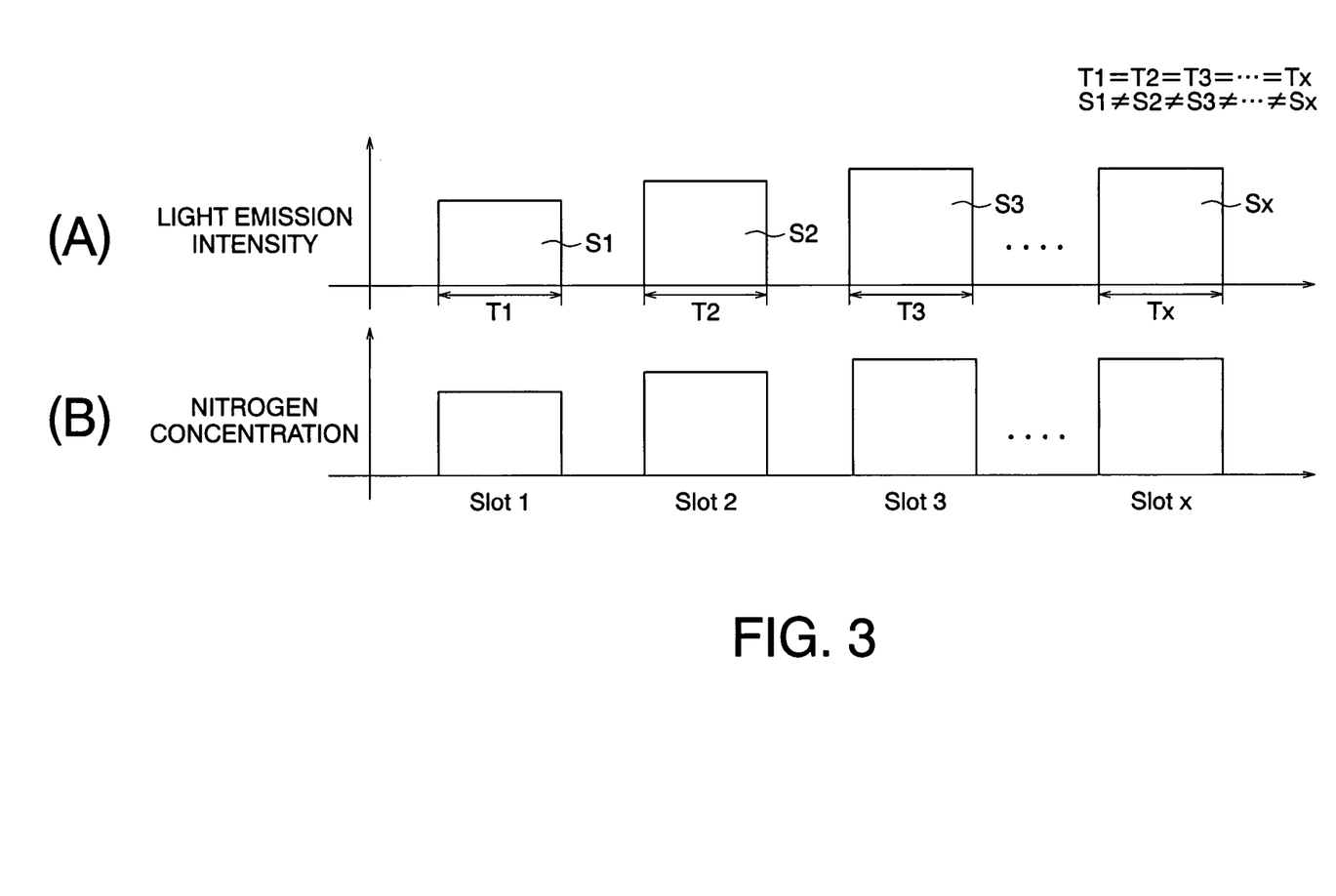
FIGS. 3A and 3B are graphs showing the results of measurements of the light emission intensity and nitrogen concentration, respectively, when nitriding was performed in accordance with Comparative Example 1.

FIG. 3A shows the relationship between light emission intensities Lx1, Lx2, Lx3, . . . , Lxx and processing times T1, T2, T3, . . . , Tx in lots Slot1, Slot2, Slot3, . . . , Slotx, respectively.

Expression (1) above holds because the light emission intensity changes from one lot to another.

Since all processing times T1, T2, T3, . . . , Tx of the individual lots are the same although the light emission intensities are different, the following relation holds.

$$T1 = T2 = T3 =, \ldots, = Tx \quad (4)$$

From expressions (1) and (4), the following relation holds between lots S1, S2, S3, . . . , Sx.

$$S1 \neq S2 \neq S3 \neq, \ldots, \neq Sx \quad (5)$$

The concentrations of nitrogen contained in silicon oxynitride films processed for constant processing times T1, T2, T3, . . . , Tx as described above were measured in the individual lots. FIG. 3B shows the results of measurements.

In this case, variations in nitrogen concentration between lots Slot1, Slot2, Slot3, . . . , Slotx are large.

Figure 4:
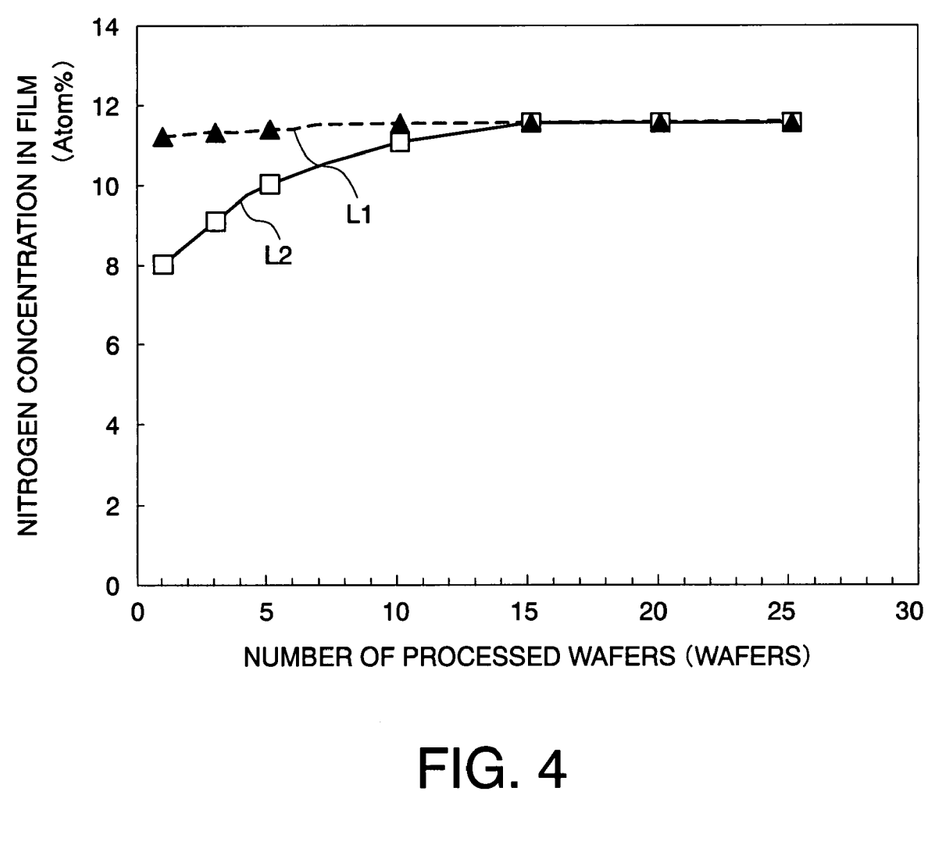
FIG. 4 is a graph showing the relationship between the number of processed wafers and the nitrogen concentration in a film when nitriding was performed in accordance with each of the first embodiment and Comparative Example 1.

FIG. 4 shows the relationship between the number of processed semiconductor substrates and the concentration of nitrogen contained in a silicon oxynitride film. Referring to FIG. 4, a dotted line L1 indicates the processing performed in accordance with the first embodiment, and a solid line L2 indicates the processing performed in accordance with Comparative Example 1.

In Comparative Example 1, the nitrogen concentration is low when the processing is started, and increases as the number of processed wafers increases. That is, the nitrogen concentration largely changes in accordance with the number of processed wafers. By contrast, in the first embodiment, the nitrogen concentration maintains a substantially constant value regardless of the number of processed wafers.

As described above, when compared to Comparative Example 1, it is possible to suppress variations in intra-lot nitrogen concentration and improve the stability when the light emission intensity is measured and the nitriding time is adjusted for each semiconductor substrate in accordance with the first embodiment.

(2) SECOND EMBODIMENT

A semiconductor device fabrication method according to the second embodiment of the present invention will be explained below. In the above first embodiment, a silicon oxynitride film is formed by nitriding a silicon oxide film on a semiconductor substrate. In the second embodiment, a silicon oxide film is formed on a semiconductor substrate.

An Ar/O$_2$ gas mixture was supplied from the gas supply port 105 shown in FIG. 1 into the vacuum vessel 101, thereby setting the internal pressure of the vacuum vessel 101 at 1 Torr. After that, plasma excitation was performed by supplying a high frequency of 13.56 mHz from the high-frequency power supply 105.

A semiconductor substrate cleaned with dilute hydrofluoric acid was loaded into the vacuum vessel 101, and a 1.5-nm thick silicon oxide film was formed by plasma oxidation.

In this state, the light emission intensity of an oxygen radical having a wavelength of 777 nm was measured by the light emission intensity analyzing sensor 107.

As the second embodiment, the plasma processing time was adjusted for each semiconductor substrate on the basis of the light emission intensity. As Comparative Example 2, all semiconductor substrates were oxidized for a predetermined plasma processing time regardless of the light emission intensity. The intra-lot stability of the film thickness of the formed silicon oxide film was measured in both the second embodiment and Comparative Example 2.

The film thickness of the formed silicon oxide film was measured by ellipsometry.

The oxidation time was adjusted for each semiconductor substrate in accordance with the second embodiment such that (the light emission intensity of the oxygen radical having a wavelength of 777 nm)×((processing time)$^{1/2}$) was constant.

Figure 5:
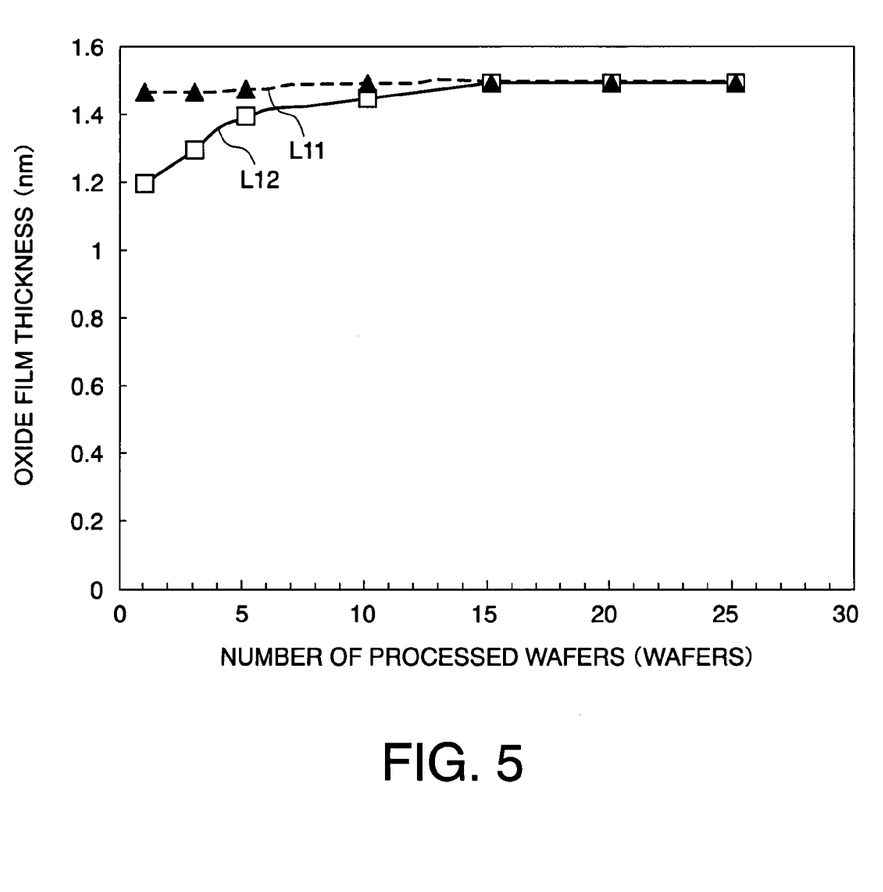
FIG. 5 is a graph showing the relationship between the number of processed wafers and the oxygen concentration in a film when oxidation was performed in accordance with each of the second embodiment and Comparative Example 2.

Referring to FIG. 5, a dotted line L11 indicates the silicon oxide film thickness as a function of the number of processed wafers when silicon oxide films were formed in accordance with the second embodiment, and a solid line L12 indicates the oxide film thickness as a function of the number of processed wafers when silicon oxide films were formed in accordance with Comparative Example 2.

As shown in FIG. 5, the intra-lot stability of the film thickness of the formed silicon oxide film improves when the oxidation time is adjusted for each semiconductor substrate on the basis of the light emission intensity in accordance with the second embodiment.

Note that in the second embodiment, the light emission intensity of the oxygen radical having a wavelength of 777 nm is measured, and the processing time is adjusted on the basis of this light emission intensity. However, it is also possible to measure light emission at another wavelength as long as the light emission is caused by oxygen.

(3) THIRD EMBODIMENT

A semiconductor device fabrication method according to the third embodiment of the present invention will be explained below. In the third embodiment, an impurity is doped into the surface of a semiconductor substrate.

An $Ar/B_2H_6$ gas mixture was supplied from the gas supply port 105 shown in FIG. 1 into the vacuum vessel 101, and the internal pressure of the vacuum vessel 101 was set at 5 mTorr. After that, plasma excitation was performed by supplying a high frequency of 13.56 mHz from the high-frequency power supply 105 into the vacuum vessel 101.

A high frequency of 400 kHz was applied to the high-frequency bias power supply 103 to adjust the ion irradiation energy to 1 keV.

A semiconductor substrate cleaned with dilute hydrofluoric acid was loaded into the vacuum vessel 101, and boron was doped by using a plasma so that the peak boron concentration in the semiconductor substrate was $10^{21}$ (atoms/cm$^3$).

More specifically, boron was ion-implanted by two different methods: in one method, the light emission intensity of a wavelength of 550 nm in light emitted from the plasma was measured and the plasma processing time was adjusted for each semiconductor substrate in accordance with the third embodiment; in the other method, the plasma processing time was held constant regardless of the light emission intensity as Comparative Example 3. The intra-lot stability of the sheet resistance after spike annealing was performed at 1,050° C. was measured by a four-probe method.

The implantation time was controlled for each semiconductor substrate in accordance with the third embodiment such that (the light emission intensity of a wavelength of 550 nm)×((processing time)$^{1/2}$) was constant.

Figure 6:
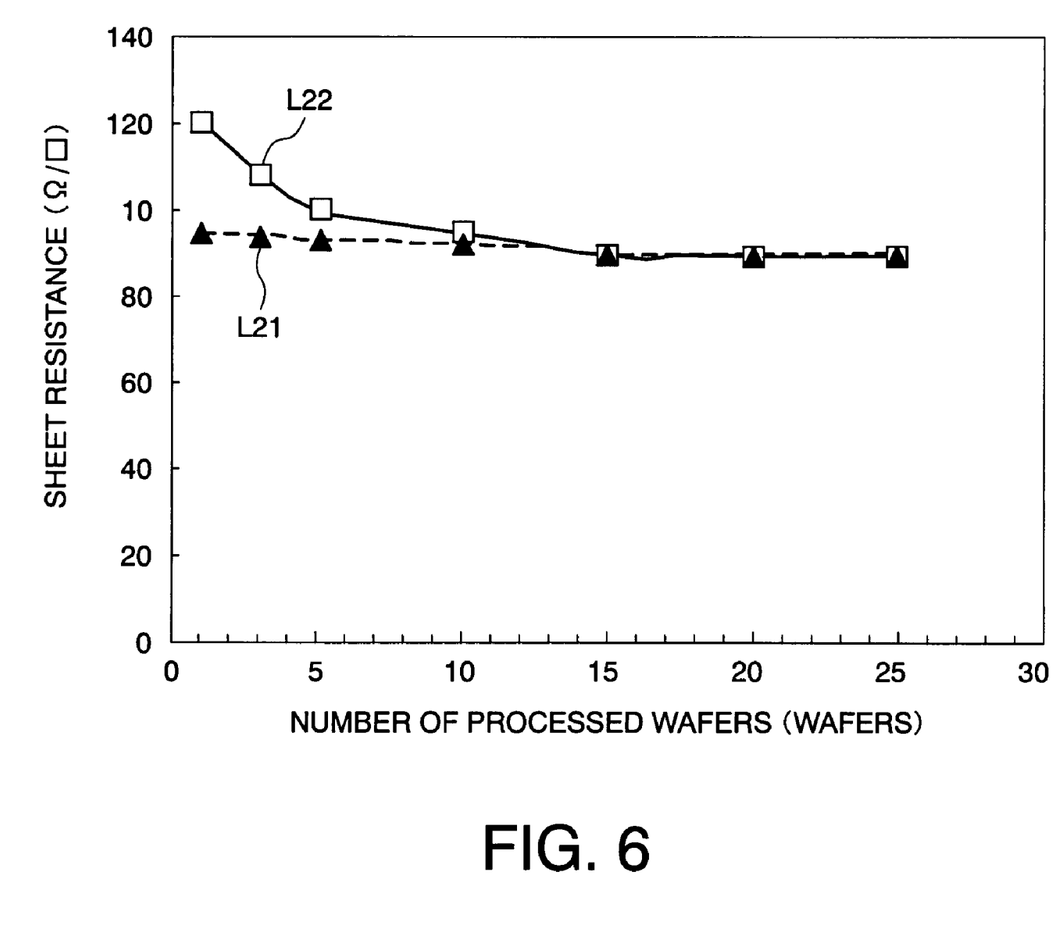
FIG. 6 is a graph showing the relationship between the number of processed wafers and the sheet resistance when impurity doping was performed in accordance with each of the third embodiment and Comparative Example 3.

Referring to FIG. 6, a dotted line L21 indicates the sheet resistance as a function of the number of processed wafers when boron was ion-implanted in accordance with the third embodiment, and a solid line L22 indicates the sheet resistance as a function of the number of processed wafers when boron was ion-implanted in accordance with Comparative Example 3.

As shown in FIG. 6, the intra-lot stability of the sheet resistance of a boron-implanted, heavily doped layer improved when the implantation time was adjusted for each semiconductor substrate on the basis of the light emission time in accordance with the third embodiment.

The semiconductor device fabrication methods and fabrication apparatuses of the above embodiments can suppress variations in film thickness or impurity amount between semiconductor substrates in a nitriding, oxidation, or impurity doping step.

The above embodiments are merely examples and do not limit the present invention. Accordingly, these embodiments can be variously modified within the technical scope of the present invention.

For example, in the first embodiment, the processing time is adjusted by measuring the light emission intensity of a nitrogen ion having a wavelength of 391 nm. However, it is also possible to measure the light emission intensity of a reaction species having another wavelength, so any light emission can be measured as long as it is caused by the reaction.

Also, in each of the first to third embodiments, the light emission intensity of a reaction species having a predetermined wavelength in light emitted from the plasma is measured, and the processing time during which a semiconductor substrate is exposed to the plasma is adjusted on the basis of the measurement value.

In addition to this adjustment of the processing time performed by the measurement of the light emission intensity, it is also possible to perform a step of measuring the incident power supplied into the vacuum vessel from the high-frequency power supply and the reflected power of this incident power, and checking, on the basis of the obtained measurement result, whether the intended light emission intensity is obtained.

For example, the incident power and reflected power have a relationship indicated by Effective power=incident power−reflected power Also, the light emission intensity and effective power have a relationship indicated by Light emission intensity=k*effective power where k is a proportional constant. When the fabrication apparatus is normally operating, k has a predetermined value.

Accordingly, the effective power is calculated by measuring the incident power and reflected power, and the proportional constant k is calculated by measuring the light emission intensity. Whether the fabrication apparatus is normally operating can be checked by checking whether the value of the proportional constant k has the original normal value.

Alternatively, it is also possible to calculate the plasma exposure time by measuring the light emission intensity, measure the tuner position for adjusting the plasma state, and adjust the plasma exposure time for each semiconductor substrate on the basis of the measurement result.

As described earlier, the tuner position reflects the plasma state, e.g., the plasma density in the vacuum vessel.

When a certain semiconductor substrate is to be processed, therefore, if the tuner position indicates that the plasma density is lower than the original set value, the plasma exposure time is adjusted to be longer than a preset value.

What is claimed is:

1. A semiconductor device fabrication method comprising:
   measuring light emission intensity of at least one type of wavelength contained in light emitted from a plasma, when one of nitriding, oxidation, and impurity doping is to be performed on a surface of a semiconductor substrate in a processing vessel by using the plasma;
   determining, for each semiconductor substrate, an exposure time during which the semiconductor substrate is exposed to the plasma, on the basis of the measured light emission intensity, such that a product of the measured light emission intensity and a square root of the exposure time is constant for each semiconductor substrate; and
   exposing each semiconductor substrate to the plasma on the basis of the calculated exposure time, thereby performing one of the nitriding, oxidation, and impurity doping.

2. A method according to claim 1, wherein when the light emission intensity is measured, light emission intensity of an $N^{2+}$ ion is measured when nitriding is to be performed.

3. A method according to claim 1, wherein when the light emission intensity is measured, light emission intensity caused by NH is measured when nitriding is to be performed by using $NH_3$ gas as a nitrogen source.

4. A method according to claim 1, wherein when the light emission intensity is measured, light emission intensity of an oxygen radical is measured when oxidation is to be performed.

5. A method according to claim 1, wherein when the light emission intensity is measured, light emission intensity of an impurity is measured when the impurity is to be doped.

6. A method according to claim 1, further comprising, measuring a tuner position for adjusting a state of the plasma, in addition to the light emission intensity of at least one type of wavelength contained in the light emitted from the plasma, when one of the nitriding, oxidation, and impurity doping is to be performed on the surface of the semiconductor substrate in the processing vessel by using the plasma, wherein when the exposure time during which each semiconductor substrate is exposed to the plasma is to be calculated, the exposure time is calculated on the basis of the measured light emission intensity, and the exposure time is adjusted for each semiconductor substrate on the basis of the tuner position.

7. A method according to claim 6, wherein when the exposure time is to be calculated on the basis of the light emission intensity, the exposure time is calculated such that a product of the measured light emission intensity and a square root of the exposure time is constant for individual semiconductor substrates.

8. A method according to claim 6, wherein when the exposure time is to be adjusted on the basis of the tuner position, if the tuner position indicates that a density of the plasma is relatively lower than the exposure time calculated on the basis of the light emission intensity, the exposure time is adjusted to be longer.

9. A method according to claim 6, wherein when the light emission intensity is measured, light emission intensity of an $N^{2+}$ ion is measured when nitriding is to be performed.

10. A method according to claim 6, wherein when the light emission intensity is measured, light emission intensity caused by NH is measured when nitriding is to be performed by using $NH_3$ gas as a nitrogen source.

11. A method according to claim 6, wherein when the light emission intensity is measured, light emission intensity of an oxygen radical is measured when oxidation is to be performed.

12. A method according to claim 6, wherein when the light emission intensity is measured, light emission intensity of an impurity is measured when the impurity is to be doped.

13. A method according to claim 1, further comprising, measuring an incident power which is incident to the processing vessel in order to generate the plasma and a reflected power which is reflected from the processing vessel, in addition to the light emission intensity of at least one type of wavelength contained in the light emitted from the plasma, when one of the nitriding, oxidation, and impurity doping is tote performed on the surface of the semiconductor substrate in the processing vessel by using the plasma, wherein an operating state of an apparatus which generates a plasma is checked on the basis of the measured light emission intensity, incident power, and reflected power.

14. A method according to claim 13, wherein when the exposure time is to be calculated on the basis of the light emission intensity, the exposure time is calculated such that a product of the measured light emission intensity and a square root of the exposure time is constant for individual semiconductor substrates.

15. A method according to claim 1, wherein before light emission intensity is measured, a silicon oxide film is formed on the surface of the semiconductor substrate, and when each semiconductor substrate is exposed to the plasma, nitriding is performed to form a silicon oxynitride film.

16. A method according to claim 1, wherein when each semiconductor substrate is exposed to the plasma, oxidation is performed to form a silicon oxide film.

17. A method according to claim 1, wherein when each semiconductor substrate is exposed to the plasma, an impurity is doped into the surface of the semiconductor substrate.

* * * * *